(12) United States Patent
Kizilyalli

(10) Patent No.: US 6,309,938 B1
(45) Date of Patent: Oct. 30, 2001

(54) DEUTERATED BIPOLAR TRANSISTOR AND METHOD OF MANUFACTURE THEREOF

(75) Inventor: Isik C. Kizilyalli, Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/386,592

(22) Filed: Aug. 31, 1999

Related U.S. Application Data

(62) Division of application No. 08/848,113, filed on Apr. 28, 1997, now Pat. No. 5,982,020.

(51) Int. Cl.⁷ .................. H01L 21/331; H01L 21/322
(52) U.S. Cl. .................. 438/310; 438/471; 438/475
(58) Field of Search .................. 438/369, 310, 438/471, 473, 474, 475

(56) References Cited

U.S. PATENT DOCUMENTS

| | | |
|---|---|---|
| 3,903,352 | 9/1975 | Horiuchi . |
| 4,268,321 | 5/1981 | Meguro . |
| 4,268,951 | 5/1981 | Elliot et al. . |
| 4,620,211 | 10/1986 | Baliga et al. .................. 357/38 |
| 4,851,370 | 7/1989 | Doklan et al. . |
| 5,248,348 | 9/1993 | Miyachi et al. . |
| 5,304,830 | 4/1994 | Sato . |
| 5,352,636 | 10/1994 | Beinglass . |
| 5,378,541 | 1/1995 | Ihara et al. . |
| 5,501,991 * | 3/1996 | Jang . |
| 5,595,927 | 1/1997 | Chen et al. . |
| 5,642,014 | 6/1997 | Hillenius . |
| 5,646,050 | 7/1997 | Li et al. . |
| 5,744,202 | 4/1998 | Nickel . |
| 5,776,831 | 7/1998 | Padmanabhan et al. . |
| 5,830,575 | 11/1998 | Warren et al. . |
| 5,872,387 | 2/1999 | Lyding et al. .................. 257/607 |
| 5,990,008 | 11/1999 | Koyama et al. . |

FOREIGN PATENT DOCUMENTS

| | | |
|---|---|---|
| 61-264350 | 11/1986 | (JP) . |
| 64-41211 | 2/1989 | (JP) . |
| 01-211970 | 8/1989 | (JP) .................. H01L/29/72 |
| 2-277269A | 11/1990 | (JP) . |
| 03-222321 | 10/1991 | (JP) . |
| 04-29312 | 1/1992 | (JP) . |
| 04-342121 | 11/1992 | (JP) . |
| 04-342122 | 11/1992 | (JP) . |
| WO 94/19829 | 9/1994 | (WO) . |

OTHER PUBLICATIONS

"American Institute of Physics Handbook," third edition, McGraw–Hill, New York, 1982 reissue, p. 8–320.*

Saks et al., The Time–Dependence of Post–Irradiation Interface Trap Build–Up in Deuterium–Annealed Oxides, IEEE Transactions on Nuclear Science, vol. 39, No. 6, pp. 2220–2229, Dec. 1992.

Ohji et al., Effects of Minutes Impurities (H,OH,F) on $SiO_2/Si$ Interface as Investigated by Nuclear Resonant Reaction and Electron Spin Resonance; IEEE Transactions on Electron Devices, vol. 37, No. 7, pp. 1635–1642, Jul. 1990.

Shigenobu Hayashi, Kikuko Hayamizu, Satoshi Mashima, Atsushi Suzuki, Peter J. Mcelheny, Satoshi Yamasaki and Akihisa Matsuda; "2D and 1H Nuclear Magnetic Resonance Study of Deuterated Amorphous Silicon and Partially Deuterated Hydrogenated Amorphous Silicon"; Japanese Journal of Applied Physics, vol. 30, No. 9A; Sep. 1991, pp. 1909–1914.

(List continued on next page.)

Primary Examiner—Charles Bowers
Assistant Examiner—Stephen W. Smoot

(57) ABSTRACT

A bipolar transistor and a method of manufacturing the transistor. The transistor includes: (1) a substrate having a base region, an emitter region and a base-emitter junction between said base and emitter regions and (2) a substantial concentration of an isotope of hydrogen located in said biploar transistor.

9 Claims, 3 Drawing Sheets

OTHER PUBLICATIONS

Yasutake Toyoshima, Akihisa Matsuda and Kazuo Arai; "In–Situ Investigation of the Growing a–Si :D Surface by Infrared Reflection Absorption Spectroscopy"; Journal of Non–Crystalline Solids 164–166 (1993) ; pp. 103–106.

N.M. Johnson, D.K. Biogelsen and M.D. Moyer; "Deuterium Passivation of Grain–Boundary Dangling Bonds in Silicon Thin Films"; Appl. Phys. Lett. 40(10), May 15, 1982; pp. 882–884.

G. Ganguly, A. Suzuki, S. Yamasaki, K. Nomoto and A. Matsuda; "Reduced Light–Induced Changes of Photoconductivity in Duterated Amorphous Silicon"; J. Appl. Phys. 68 (7), Oct. 1, 1990; pp. 3738–3740.

Jerzy Kanicki; "Amorphous and Microcrystalline Semiconductor Devices: Optoelectronic Devices"; (1991) pp. 13–21.

S. Sugiyama, J. Yang and S. Guha; "Improved Stability Against Light Exposure in Amorphous Deuterated Silicon Alloy Solar Cell"; Appl. Phys. Lett. 70 (3), Jan. 20, 1997; pp. 378–380.

Kjell O. Jeppson and Christer M. Svensson; "Negative Bias Stress of MOS Devices at High Electric Fields and Degradation of NMOS Devices"; Journal of Applied Physics, vol. 48, No. 5, May 1997; pp. 2004–2014.

Mehrdad M. Moslehi and Krishna C. Saraswat; "Formation of MOS Gates by Rapid Thermal/Microwave Remote–Plasma Multiprocessing"; IEEE Electron Device Letters, vol. EDL–8, No. 9, Sep. 1987; pp. 421–424.

J.W. Lyding, K. Hess and Isik C. Kizilyalli; "Reduction of Hot Electron Degradation in Metal Oxide Semiconductor Transistors by Deuterium Processing"; Appl. Phys. Lett. 68 (18), Apr. 29, 1996; pp. 2526–2528.

I.C. Kizilyalli, J.W. Lyding and K. Hess; "Deuterium Post-Metal Annealing of MOSFET's for Improved Hot Carrier Reliability"; IEEE Electron Device Letters, vol. 18, No. 3, Mar. 1997; pp. 81–83.

S.M. Sze; "Physics of Semiconductor Devices", A Wiley-Interscience Publication; p. 850, Second Edition (1981).

* cited by examiner

DEUTERATED BIPOLAR TRANSISTOR AND METHOD OF MANUFACTURE THEREOF

This Application is a Divisional of prior application Ser. No. 08/848,113 filed on Apr. 28, 1997, now U.S. Pat. No. 5,982,020, to Isik Kizilyalli, et al. The above-listed Application is commonly assigned with the present invention and is incorporated herein by reference as if reproduced herein in its entirety under Rule 1.53(b).

TECHNICAL FIELD OF THE INVENTION

The present invention is directed, in general, to a transistor fabrication and, more specifically, to a bipolar transistor in which the base-emitter junction therein is exposed to deuterium while the transistor is being fabricated and a method of manufacture of such a transistor.

BACKGROUND OF THE INVENTION

The use of silicon in devices, such as n-p-n bipolar transistors, is well known. Equally well known is the time dependent degradation of these devices, which is caused by reverse-bias stress of the emitter-base junction of the n-p-n transistors. Reverse-bias stress results in the degradation of the common-emitter current gain ($H_{FE}=\Delta I_C/\Delta I_B$). However, it is thought that the collector current ($I_C$) is not affected by the stress, but an increase in the recombination component of the base current at low $V_{BE}$ has been observed. In BICMOS and BINMOS circuits this reverse-biasing will result in a long term performance degradation and eventually circuit failure. It is believed that the nature of the damage mechanism is that hot carriers generated in the reverse-biased base-emitter junction create interface trap states on the base oxide by breaking silicon/hydrogen, often referred to as the hot carrier degradation effect. More specifically, it is believed that the base-oxide damage (interface trap generation) is caused by the interaction of hot electrons with the $Si/SiO_2$ interface. Electrons that are generated by band-to-band (from the valence band to the bottom of the conduction band) tunneling at the base-emitter junction are subsequently accelerated (heated) by the junction electric field. In most cases, the substrate, as well as other structures within the device, comprises silicon, and the defects are thought to be caused by dangling bonds (i.e., unsaturated silicon bonds) that introduce states in the energy gap, which remove charge carriers or add unwanted charge carriers in the device, depending in part on the applied bias. While dangling bonds occur primarily at surfaces or interfaces in the device, they also are thought to occur in the bulk oxide. To alleviate the problems caused by such dangling bonds, a hydrogen passivation process has been adopted and has become a well-known and established practice in the fabrication of such devices.

In the hydrogen passivation process, it is thought that the defects that affect the operation of semiconductor devices are removed when the hydrogen bonds with the silicon at the dangling bond sites. While the hydrogen passivation process eliminates the immediate problem associated with these dangling bonds, it does not eliminate degradation permanently because the hydrogen atoms that are added by the passivation process can be "desorbed" or removed from the previous dangling bond sites by the hot carrier effect.

A hot carrier is an electron or hole that has a high kinetic energy, which is imparted to it when voltages are applied to electrodes of the device. Under such operating conditions, the hydrogen atoms, which were added by the hydrogen passivation process, are knocked off by the hot electrons. This hydrogen desorption results in aging or degradation of the device's performance. This hot carrier effect is particularly of concern with respect to smaller devices, such as bipolar transistors.

Accordingly, what is needed in the art is a bipolar transistor device and a method of manufacture therefore that does experience the level of efficiency degradation experienced by the devices that are passivated with conventional hydrogen passivation processes. The present invention addresses these needs.

SUMMARY OF THE INVENTION

To address the above-discussed deficiencies of the prior art, the present invention provides a bipolar transistor and a method of manufacturing the transistor. The transistor includes: (1) a substrate having a base region, an emitter region and a base-emitter junction between said base and emitter regions and (2) a substantial concentration of an isotope of hydrogen located in the vicinity of the base-emitter junction.

The present invention therefore introduces the broad concept of employing, in lieu of hydrogen, an isotope of hydrogen to passivate material in the base-emitter junction in a bipolar transistor. For purposes of the present invention, "substantial concentration" is defined as a concentration of at least $10^{16}$ cm$^{-3}$ of isotopic hydrogen.

In one embodiment of the present invention, the isotope is deuterium. The principles of the present invention may be applied to heavier isotopes of hydrogen including tritium and any later-discovered isotopes.

In one embodiment of the present invention, the transistor further comprises a collector region in said substrate and a base-collector junction between said base and collector regions. Those who are skilled in the art may recognize benefits in deuterating the base-collector junction, as well, although such is not necessary to the present invention.

In another embodiment of the present invention, the base-emitter junction is capable of transmitting reverse-bias electrical currents. As mentioned above, reverse-bias currents can be injurious to bipolar transistors not having deuterated base-emitter junctions.

In one embodiment of the present invention, the emitter region is at least partially composed of polysilicon that has a substantial concentration of a hydrogen isotope located or incorporated therein. Those who are skilled in the art are familiar with polysilicon structures that may be deposited on a substrate to form poles of a transistor.

In yet another embodiment of the present invention, the transistor further comprises a dielectric layer located over the life substrate. In preferred embodiments, the dielectric also has a substantial concentration of a hydrogen isotope located or incorporated therein. The present invention is fully compatible with current nonisotopic hydrogen passivation techniques, which can work with dielectric layers.

In another embodiment of the present invention, the isotope is covalently bonded to material in the base-emitter junction. Alternative bonding structures may exist, however. The present invention is independent of the type of bond between the isotope and the material in the base-emitter junction.

In yet another embodiment of the present invention, the substrate is generally planar and the isotope is concentrated in portions of a planar surface of the substrate. Thus, the isotope may be patterned.

In another embodiment of the present invention, the substrate is composed at least partially of silicon. However, other conventional or later-discovered substrate materials are within the scope of the present invention.

In one embodiment of the present invention, the transistor further comprises at least one electrical conductor that carries electrical current to the transistor. Those who are skilled in the art will recognize that the present invention allows, but does not require, electrical conductors to be associated with the substrate.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
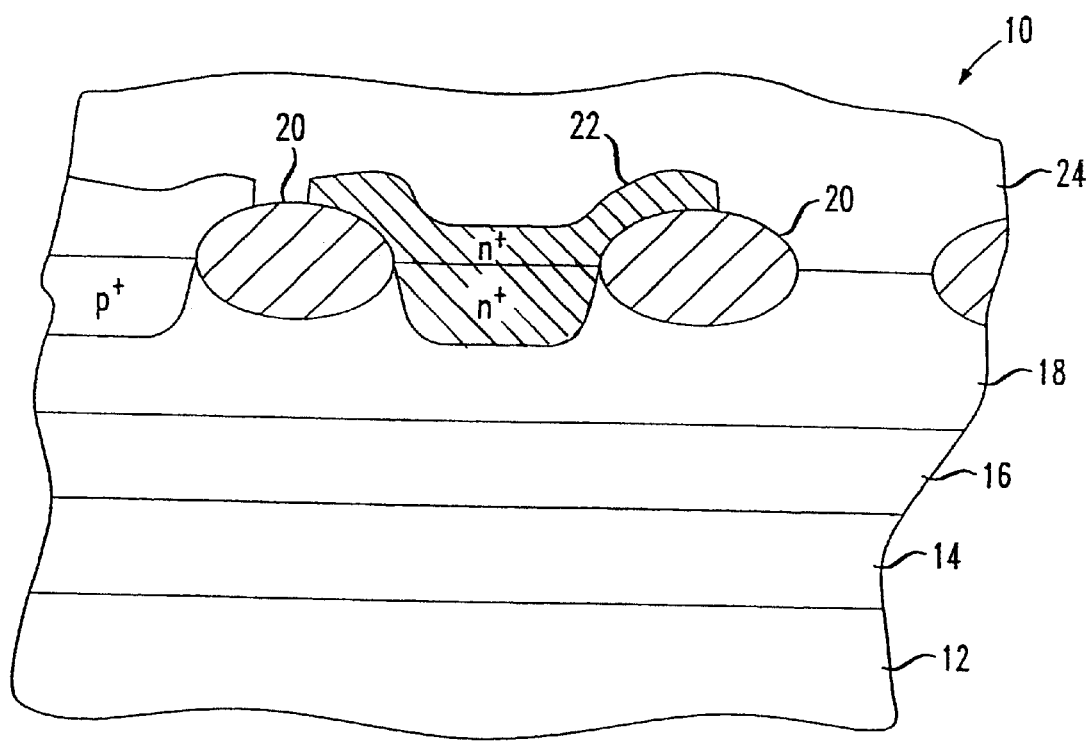
FIG. 1 illustrates a schematic cross-sectional view of a bipolar transistor.

Referring initially FIG. 1, there is illustrated a schematic, cross-sectional view of a bipolar transistor device 10 of the present invention, which is preferably a n-p-n transistor. In advantageous embodiments, the bipolar transistor 10 is comprises a substrate 12 with a collector 14 formed over it. In preferred embodiments, the substrate 12 is a p-type substrate and the collector is a $n^+$-type that has a $n^-$-type layer 16 formed over it with a p-type base 18 formed over the $n^-$layer 16. The substrate 12, collector 14 and the above-mentioned subsequent layers are formed by conventional processes. The substrate 12 may comprise silicon, germanium, gallium arsenide or other presently known or later-discovered materials that are suitable for the manufacture of such bipolar transistors. In one desirable embodiment, however, the substrate 12 is composed at least in part of silicon.

In a more detailed embodiment, the bipolar transistor 10 includes one or more base dielectric structures 20. The base dielectric structure 20 contains a substantial concentration of a hydrogen isotope and is, preferably, thermally grown in the presence of an isotopic steam of hydrogen. For purposes of the present invention, the isotopic steam should have as high a concentration of the hydrogen isotope as possible. In more advantageous embodiments, the nonisotopic hydrogen should not exceed 1 ppm within the steam. In one advantageous embodiment, the isotopic steam is deuterium ($D_2O$), however, the principles of the present invention may be applied to even heavier isotopes of hydrogen, including ionic forms of the various isotopes of hydrogen.

Alternatively, the base dielectric structure 20 may be chemically deposited from a gas mixture containing a substantial concentration of a hydrogen isotope, such as deuterium. For purposes of the present invention, "substantial concentration" is defined as a concentration of at least about $10^{16}$ cm$^{-3}$ of isotopic hydrogen. Representative examples of such gases and gas mixtures include: deuterated silane and oxygen ($SiD_4+O_2$), deuterated silane and nitrous oxide ($SiD_4+N_2O$), deuterated tetraethyl orthosilicate (TEOS, $Si(OC_2D_5)_4$), deuterated silane ($SiD_4$), deuterated nitride ($ND_3$) or deuterated dichlorosilane and nitrous oxide ($SiCl_2D_2+N_2O$). Other gas mixtures typically used to form various structures within the bipolar transistor 10 may also be used, with the exception that they contain a substantial concentration of isotopic hydrogen. In advantageous embodiments, the ordinary or nonisotopic hydrogen should not exceed 1 ppm within the gas mixture. The gas mixture is injected into the deposition chamber and passivation is conducted at temperatures ranging from about 100° C. to about 1100° C. The pressure at which the passivation occurs may be either at, above or well below atmospheric pressures, and the flow rate of the gaseous material will depend on the equipment used for depositions. These conditions combine, to form a preferred formation rate that may range from about 0.01 nm to about 100.0 nm per minute. However, in more desirable embodiments, the formation rate may range from about 1 nm to about 20 nm.

When the base dielectric structure 20 is passivated with the hydrogen isotope, it is believed that the dangling bond sites are occupied by the hydrogen isotope. It is further believed that this passivation greatly reduces degradation within the bipolar transistor 10 because the dangling bond sites are no longer available to remove charge carriers or add unwanted charge carriers in the device. Furthermore, the hydrogen isotope may form a bond with the substrate 12 that is harder to break resulting in more reliable devices, optical or electrical. A suggested explanation why the bond is harder to break is that the hydrogen's isotopes have a heavier mass than ordinary hydrogen, which makes it more difficult to remove the isotope. Thus, the presence of the hydrogen isotope within the base dielectric structure 20 offers distinct advantages over the devices of the prior art.

Also illustrated in FIG. 1 is an emitter structure 22 that has been deposited, doped and etched using conventional processes. The emitter structure 22 is typically positioned over the p-type base 18 and preferably comprises polysilicon. A hydrogen isotope may be incorporated into this structure by gaseous deposition of a silicon material containing a substantial concentration of a hydrogen isotope. The process for forming the emitter structure 22 is well known, with the exception, of course of the use of a gaseous material containing a substantial concentration of a hydrogen isotope. Representative examples of such deposition gases could include deuterated silane ($SiD_4$). In advantageous embodiments, the ordinary or nonisotopic hydrogen does not exceed 1 ppm within the gas mixture. The temperature at which the gas mixture is injected into the deposition chamber is pressure dependent and may vary substantially. The pressure at which the passivation is conducted may be either at, above or well below atmospheric pressures. The rate of deposition may also vary, depending on the desired thickness and uniformity of the layer. The conditions and processes for depositing the isotopic hydrogen gas are known to those who are skilled in the art. Deposition conditions combine to form a preferred formation rate that may range from about 0.01 nm to about 10.0 nm per minute. However, in more desirable embodiments, the formation rate may range from about 0.5 nm to about 3 nm.

When the emitter structure 22 is passivated with the hydrogen isotope, it is believed that the dangling bond sites within it are occupied by the hydrogen isotope as previously explained. This stronger hydrogen isotope/silicon bond provides transistors that are more robust and that has a substantially lower rate of degradation.

The substrate 12, base dielectric structures 20 and emitter structure 22 provide a resulting structure that is representative of a foundational level typically found in the early stages of bipolar transistor fabrication processes.

Subsequent to the formation of the emitter structure 22, the entire foundation level may have a dielectric 24 formed over it to form a foundation for the next interconnect level. The dielectric 24 may be formed by conventional process with the exception that the gaseous material, such as deuterated TEOS or deuterated silaane, must have a substantial concentration of a hydrogen isotope therein. As seen from FIG. 1, the present invention can be used to incorporate a hydrogen isotope into the various structures within the bipolar transistor 10, if so desired. When so incorporated, the hydrogen isotope provides a structure having the above-described advantages associated therewith.

Alternatively, or in addition to the processes discussed above, the hydrogen isotope may be incorporated into the bipolar transistor either at any time during the manufacturing process or at the end of the process and just prior to the capping of the device. In such embodiments, the hydrogen isotope is introduced at temperatures ranging from about 200° C. to about 1000° C. in a forming gas anneal step for time periods ranging from about 10 minutes to 2 hours or more. The forming gas may be, for example, a mixture of nitrogen and the hydrogen isotope, or a mixture of nonisotopic hydrogen and the hydrogen isotope. This annealing step is well known with the exception that a hydrogen isotope is present and is present within the gas mixture in a substantial concentration as discussed above.

Figure 2:
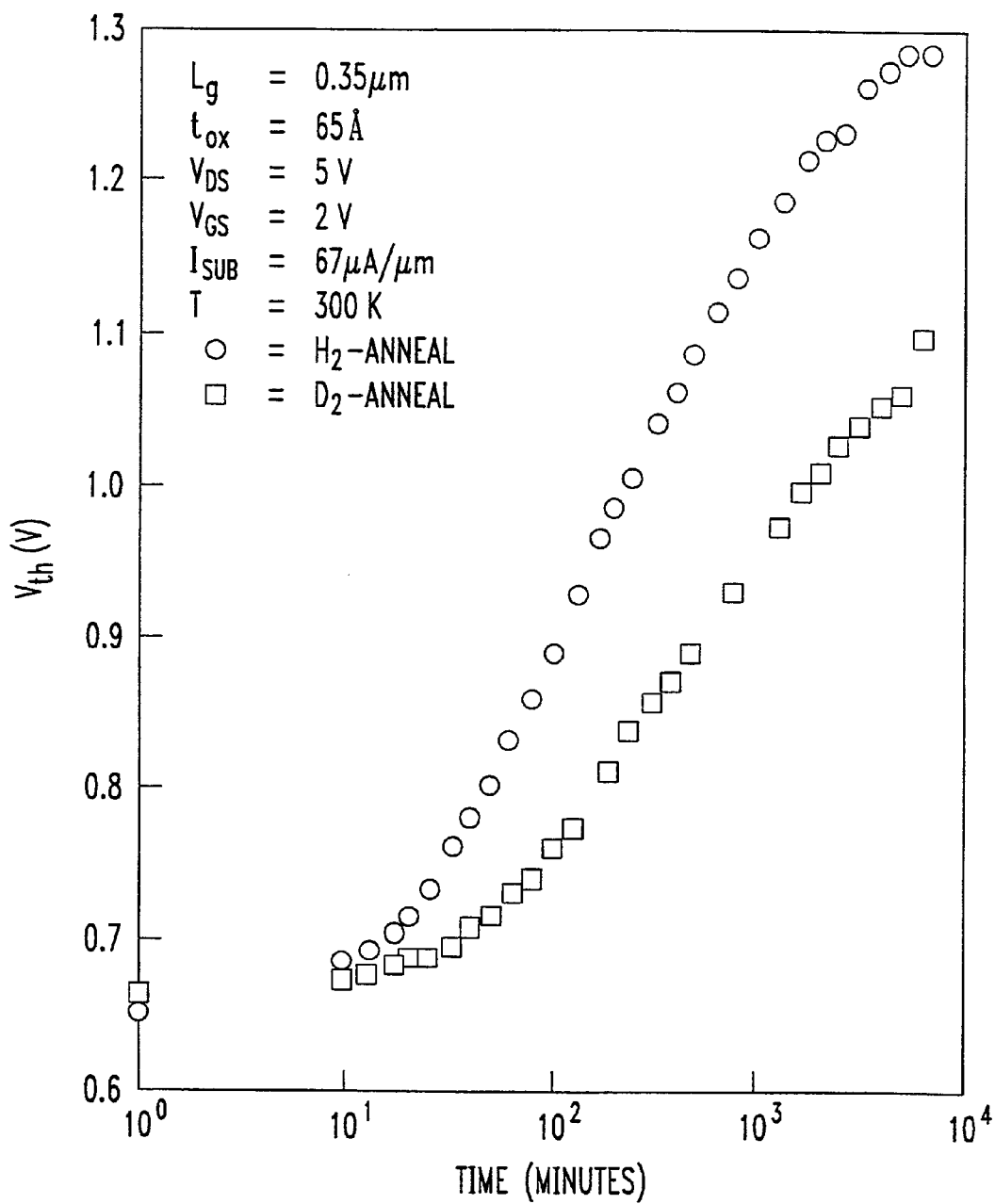
FIG. 2 illustrates a graph that shows hot carrier stress experiments conducted on a transistor at peak substrate current conditions.
Figure 3:
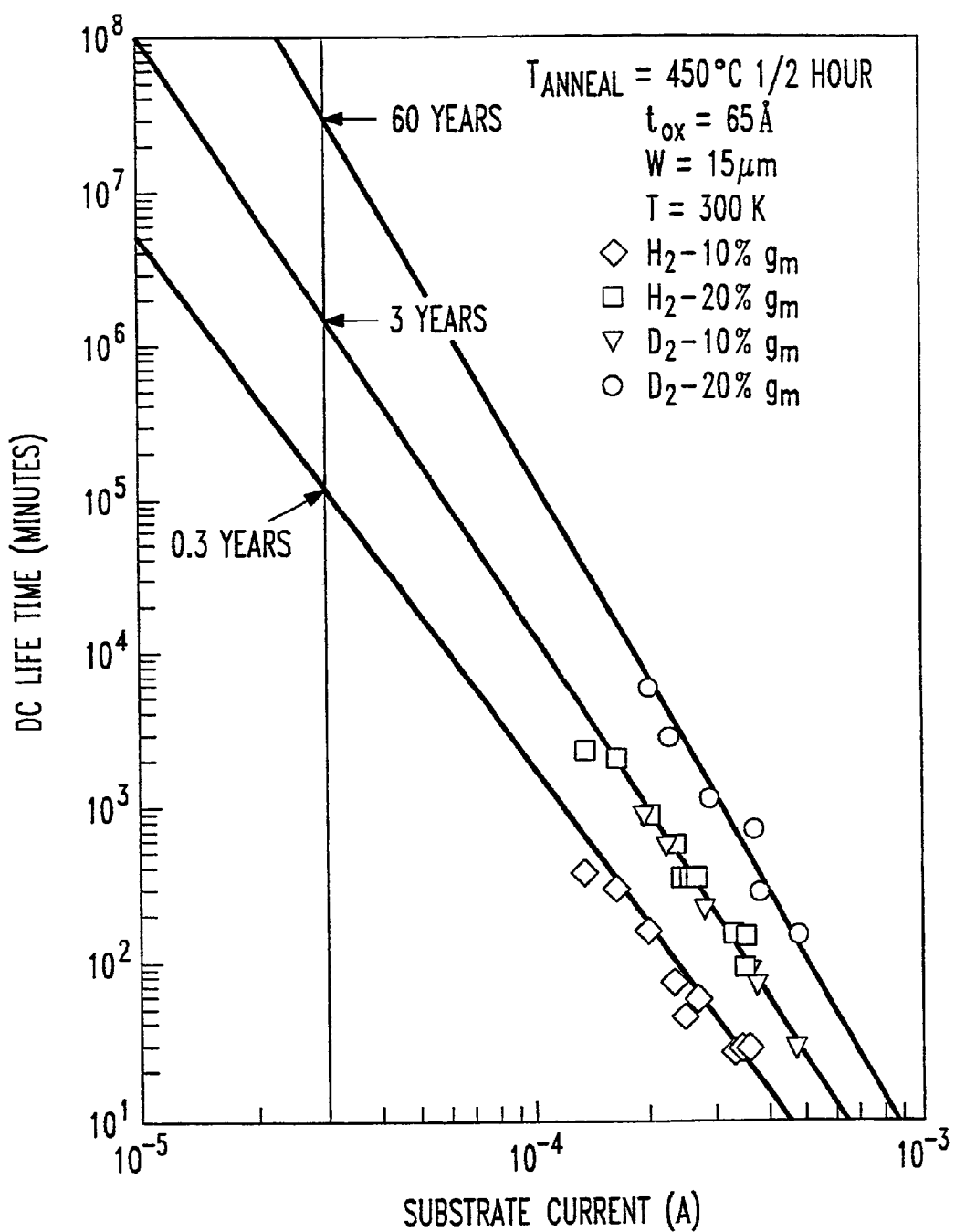
FIG. 3 illustrates a transistor lifetime versus substrate current.

FIG. 2 is a graph that illustrates hot carrier stress experiments conducted on transistors at peak substrate current conditions. The interface damage, caused by hot carriers, is observed by monitoring the change in the linear transconductance ($g_m$) and threshold voltage ($V_{th}$) of the NMOS transistor. FIG. 3 also shows the $V_{th}$ degradation as a function of stress time. As shown by the graph, the degradation of the transistor passivated with hydrogen is significantly higher than the degradation observed for the device passivated with deuterium. The threshold voltage for the deuterium passivated device increases to only about 1.05 volts over a period of $10^4$ minutes whereas at that same period of time, the threshold voltage for the hydrogen passivated device increases to 1.3 volts.

FIG. 3 shows NMOS transistor lifetime versus substrate current. From this data it is evident that devices annealed in hydrogen isotopes, such as deuterium, are much more robust under channel hot electron stress. The extrapolated transistor lifetimes are indicated using various degradation criteria. Given the similar structures between the NMOS and the bipolar transistor devices covered by the present invention, it is apparent that the same results could be expected in bipolar transistor devices as appears in the NMOS devices.

From the foregoing it is readily seen that the present invention provides a bipolar transistor and a method of manufacturing the transistor. The transistor includes: (1) a substrate having a base region, an emitter region and a base-emitter junction between said base and emitter regions and (2) a substantial concentration of an isotope of hydrogen located in the vicinity of the base-emitter junction. The present invention, therefore, introduces the broad concept of employing, in lieu of hydrogen, an isotope of hydrogen to passivate material in the vicinity of the base-emitter junction in a bipolar transistor. For purposes of the present invention, "substantial concentration" is defined as a concentration of at least $10^{16}$ cm$^{31 \ 3}$ of isotopic hydrogen.

The foregoing has outlined, rather broadly, preferred and alternative features of the present invention so that those who are skilled in the art may better understand the detailed description of the invention that follows. Additional features of the invention that form the subject of the claims of the invention are described below. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

What is claimed is:

1. A method of manufacturing a bipolar transistor, comprising:
    forming a base region, an emitter region and a base-emitter junction between said base and emitter regions in a substrate; and
    introducing a substantial concentration of an isotope of hydrogen in said base-emitter junction.

2. The method as recited in claim 1 wherein said isotope is deuterium.

3. The method as recited in claim 1 further comprising forming a collector region and a base-collector junction between said base and collector regions in said substrate.

4. The method as recited in claim 1 further comprising introducing a substantial concentration of an isotope of hydrogen in said emitter region, wherein said emitter region is at least partially composed of polysilicon.

5. The method as recited in claim 1 further comprising forming a dielectric layer over said substrate and introducing a substantial concentration of an isotope of hydrogen in said dielectric layer.

6. The method as recited in claim 1 wherein said introducing comprises introducing a substantial concentration of an hydrogen isotope into said emitter region.

7. The method as recited in claim 1 wherein a surface of said substrate is generally planar, wherein said method comprises concentrating said isotope in portions of said planar surface of said substrate.

8. The method as recited in claim 1 wherein said substrate is composed at least partially of silicon.

9. The method as recited in claim 1 further comprising forming at least one electrical conductor to carry electrical current to said transistor.

* * * * *